United States Patent [19]

Rideout et al.

[11] Patent Number: 4,872,180
[45] Date of Patent: Oct. 3, 1989

[54] METHOD FOR REDUCING FACET REFLECTIVITIES OF SEMICONDUCTOR LIGHT SOURCES AND DEVICE THEREOF

[75] Inventors: William C. Rideout, Townsend; Elliot Eichen, Arlington, both of Mass.

[73] Assignee: GTE Laboratories Incorporated, Waltham, Mass.

[21] Appl. No.: 367,399

[22] Filed: Jun. 16, 1989

[51] Int. Cl.$^4$ .............................................. H01S 3/08
[52] U.S. Cl. ...................................... 372/99; 372/46; 372/108
[58] Field of Search ................... 372/6, 43, 46, 48, 49, 372/99, 107, 108; 350/96.12

[56] References Cited

U.S. PATENT DOCUMENTS

| | | | |
|---|---|---|---|
| 4,323,856 | 4/1982 | de Waard | 372/46 |
| 4,405,236 | 9/1983 | Mitsuhashi et al. | 372/46 |
| 4,821,276 | 4/1989 | Alphonse et al. | 372/46 |
| 4,821,277 | 4/1989 | Alphonse et al. | 372/46 |

FOREIGN PATENT DOCUMENTS

| | | | |
|---|---|---|---|
| 2834006 | 3/1979 | Fed. Rep. of Germany | 372/46 |
| 0060087 | 5/1981 | Japan | 372/46 |
| 0154691 | 8/1985 | Japan | 372/43 |
| 0158377 | 7/1987 | Japan | 372/43 |

OTHER PUBLICATIONS

Dixon et al.; "Stripe-Geometry D.H. Lasers with Linear Output/Current Characteristics"; Elect. Letters; Jul. 7, 1977; vol. 13, #14, pp. 400–401.

Yamaguchi et al., "High-Efficiency and High-Speed Operation . . . New Window Structure" Technical Digest, Optical Fiber Communications Conf., (U.S.A., THK4 (1988).

Ogita et al., "Long Cavity Multiple-Phase-Shift DFB Laser for Linewidth Narrowing", Technical Digest, Optical Fiber Comm. Conf., U.S.A., TUH2 (1989).

Zah et al., "Fabrication and Performance . . . Amplifiers with Angled Facets", Electronics Letters, vol. 23, No. 19, Sep. 10 (1987).

Zah et al., "1.3$\mu$ GaInAsP Near-Travelling-Wave Laser Amplifiers . . . Antireflection Coatings", Electronics Letters, vol. 24, No. 20, Sep. 29, (1988).

Cha et al., "1.5 $\mu$ m Band Travelling-Wave Semiconductor . . . Facet Structure", Electronics Letter, vol. 25, No. 3, Feb. 2, (1989).

Primary Examiner—William L. Sikes
Assistant Examiner—B. R. R. Holloway
Attorney, Agent, or Firm—James J. Cannon, Jr.

[57] ABSTRACT

A novel method for reducing the facet reflectivities of semiconductor light sources and amplifiers concerns the use of a bulk (non-waveguiding) index-matched regrown end cap region at both of the major facet surfaces of the amplifier. The amplifier has a tilted stripe geometry which, in combination with the end cap regions, enable the amplifier to reproducibly achieve facet reflectivities of less than $10^{-5}$ while avoiding a facet coating step. The improved optical amplifier is more amenable to mass production and less sensitive to both wavelength and polarization.

7 Claims, 3 Drawing Sheets

METHOD FOR REDUCING FACET REFLECTIVITIES OF SEMICONDUCTOR LIGHT SOURCES AND DEVICE THEREOF

FIELD OF THE INVENTION

This invention relates to optoelectronics and, more particularly, to a novel method for reducing the facet reflectivity of optoelectronic components employing waveguiding structures, such as semiconductor laser amplifiers and superluminescent light emitting diodes.

BACKGROUND OF THE INVENTION

Laser amplifiers have many possible applications in future fiber optic communication systems, including overcoming losses in transmission and switching systems and in increasing receiver sensitivity. Very low facet reflectivities, which have proven to be difficult to achieve, are the key to producing high quality semiconductor laser amplifiers.

Current research efforts regarding semiconductor laser amplifiers have focused on the reduction of facet reflectivity due to the enhanced performance of certain key amplifier properties. In an ideal travelling-wave amplifier, the incoming light enters one side of the amplifier, undergoes gain as it propagates, and exits without loss from the other side. Unfortunately, the gain available from the amplifier is limited since the amplifier must avoid positive optical feedback necessary for lasing and, more specifically, must prevent the Fabry-Perot resonances exhibited during lasing operation because they cause the gain to be strongly wavelength-dependent. Since the feedback mechanism is influenced by the degree of reflectivity which exists at the device facets, a low facet reflectivity is extremely important for suppressing the Fabry-Perot resonances and achieving high quality amplifier performance. Furthermore, the noise performance of the amplifier improves with decreasing facet reflectivity.

Two conventional approaches have been used to reduce the reflectivity of the semiconductor amplifier facets: coating the facets with an anti-reflection material and tilting the facets. Zah et al. in Electronics Letters, 1987, disclose a double-channel ridge-waveguide travelling-wave amplifier (TWA) having angled facets which suppress Fabry-Perot resonances by reducing the amount of reflected light that is coupled back into the amplifier waveguide. The amplifier achieved a residual modal reflectivity of about $2 \times 10^{-3}$ with the angled facet structure, while a further reduction in reflectivity to a value of $10^{-4}$ occurred when a 1% anti-reflection coating was applied to both facet surfaces. The combination of angled facets and anti-reflection coatings also appears in a GaInAsP near-travelling-wave (NTW) laser amplifier disclosed by Zah et al. in Electronics Letters, 1988, that has experimentally demonstrated a lower facet reflectivity of $5.8 \times 10^{-4}$ However, this value has been difficult to achieve reproducibly for a number of reasons. One reason concerns the sensitivity of facet coating to errors in thickness and index of refraction, where the best results have been obtained by the expensive process of individually coating each facet using in-situ monitoring of its output. Furthermore, the reflectivity of facet coatings can degrade with time due to environmental effects. In addition, the reflectivity of angled facets can only be made very small with very exact control of active dimensions, again indicating that only a small yield of low reflectivity devices is possible with conventional techniques.

Recently, a new and improved optical amplifier structure capable of achieving reflectivities as low as $3 \times 10^{-5}$ was disclosed by Cha et al. in Electronics Letters, 1989. This travelling-wave optical amplifier is distinguished from the aforementioned conventional amplifiers by the presence of a window facet region adjacent to the amplifier facet surface from which the output optical signal appears and is coupled to an optical fiber. An anti-reflection coating is applied to the outer facet of the window at the window-air interface. Disadvantageously, the amplifier suffers from a large coupling loss of 8 dB at the window facet-fiber interface in addition to the above-described fabrication problems associated with the application of anti-reflection coatings.

OBJECTS OF THE PRESENT INVENTION

It is a primary object of the present invention to obviate the above-noted and other disadvantages of the prior art.

It is a further object of the present invention to provide a novel method for reducing the facet reflectivities of optoelectronic components based on waveguiding structures without applying a coating of anti-reflection material.

It is a yet further object of the present invention to provide an optical amplifier having index-matching end cap regions at the facets of the device and a tilted stripe geometry which achieves ultra-low reflectivities without introducing additional coupling losses.

It is a yet further object of the present invention to provide an optical amplifier allowing ultra-low reflectivity to be reproducibly obtained, thereby making mass production feasible.

SUMMARY OF THE INVENTION

In one aspect of the present invention, a body of semiconductor material having two opposed major facet surfaces and an angled waveguiding structure is fabricated to form an optoelectronic device such as a semiconductor laser amplifier. A regrown end cap region is formed adjacent to each of the major facet surfaces wherein each regrown end cap region consists of a dielectric material having an index of refraction which is approximately equal to the effective index of the waveguiding structure. This index-matching feature minimizes reflections at the interface between each major facet surface and the correspondingly adjacent end cap region. Since the end cap region is non-waveguiding, very little of the light which is reflected at the interface of the air and outer facet surface of the respective end cap region is coupled back into the waveguide, thereby greatly reducing the effective facet reflectivity of the amplifier. Furthermore, since the waveguide is angled with respect to the outer facet surface, the reflected light is displaced away from the waveguide, even further reducing the effective facet reflectivity.

The aforementioned optoelectronic device is fabricated by a corresponding method for reducing facet reflectivity, and therefore includes a step of providing a body of semiconductor material having two opposed major facet surfaces and an angled waveguiding structure. A forming step places a first regrown end cap region adjacent to the first major facet surface and places a second regrown cap region adjacent to the second major facet surface. Both of said end cap regions have an index of refraction which is approximately equal to an effective refractive index of the waveguiding structure, thereby minimizing reflections at the interface of each major facet surface and the respective end cap region. Since the waveguide is angled with respect to the outer facet surface, the reflected light is displaced away from the waveguide and thus not coupled back into the waveguiding structure, thereby providing a low effective facet reflectivity.

BRIEF DESCRIPTION OF THE DRAWINGS

FIG. 2b is an upper view of the laser amplifier of FIG. 1 showing the path of reflected light illustrated in FIG. 2a;

DETAILED DESCRIPTION OF THE PREFERRED EMBODIMENTS

Figure 1:
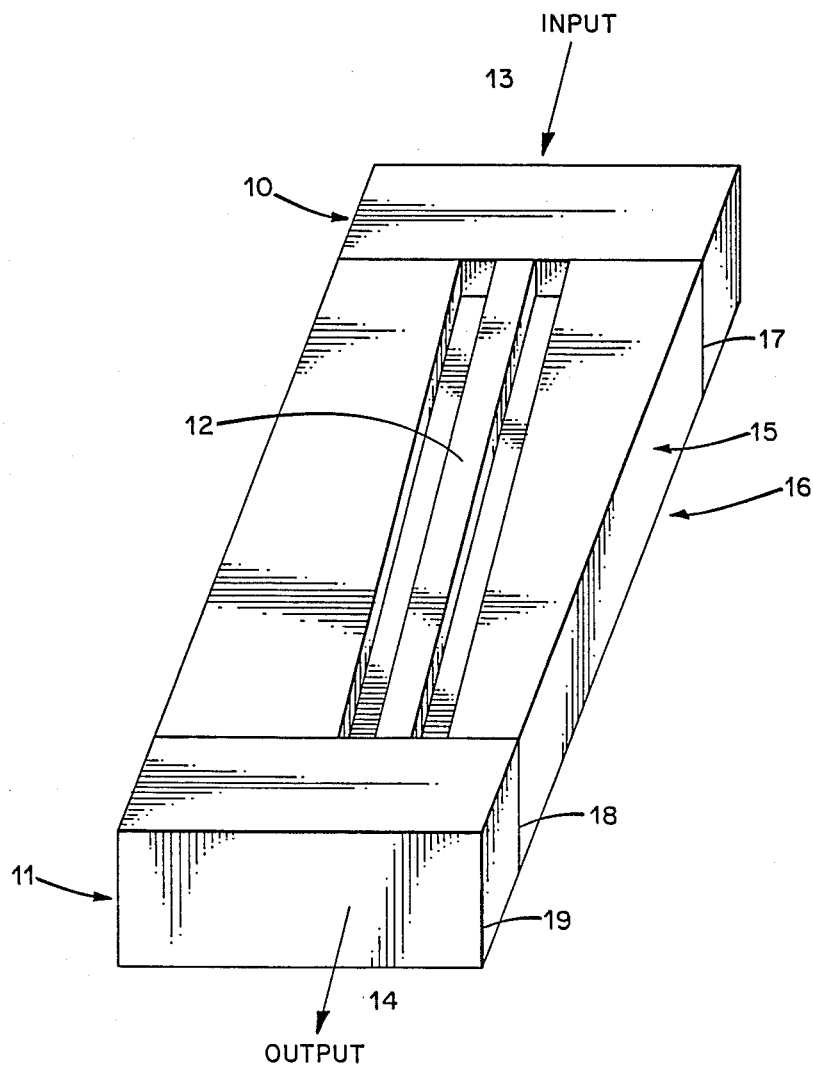
FIG. 1 is a perspective view of a laser amplifier having regrown end cap regions in accordance with the present invention.

The present invention concerns a method for reducing the facet reflectivity of an optoelectronic device employing a waveguiding structure and is illustrated in FIG. 1 for a semiconductor laser amplifier. Although a laser amplifier is shown for exemplary purposes, it should be well known to those skilled in the art that other semiconductor devices, such as superluminescent light emitting diodes, are capable of incorporating the method described herein and thus fall within the scope of the present invention.

The amplifier 16 consists of a body of semiconductor material 15 having a ridged waveguide structure 12 formed longitudinally across the semiconducting region 15 to form a double-channel ridge-waveguide optical amplifier. In one aspect of the method for reducing reflectivity in accordance with the present invention, the waveguide is oriented at a predetermined angle away from the longitudinal axis of semiconducting body 15. The fabrication techniques to produce such an amplifier are well-known in the art. The reflectivity of this tilted-waveguide amplifier structure is reduced even further as described hereinbelow with regard to other aspects of the novel method for reducing reflectivity.

At an input end 13 of amplifier 16, a bulk (non-waveguiding) material is regrown at facet 17 of amplifier 16 to form a first end cap region 10. Similarly, at output end 14, a non-waveguiding material is regrown at facet 18 to form a second end cap region 11. For purposes of clarity, facets 17 and 18 of amplifier 16 will be hereinafter referred to as amplifier-end cap interfaces since they both serve as boundaries between respective ends of the amplifier and the corresponding regrown end cap region. The end cap regions consist of a material having a sufficiently higher bandgap energy than that of the waveguide to prevent significant absorption of the optical signal in the end cap regions. Moreover, the bulk material in each end cap region has an index of refraction very close to that of the effective refractive index of the waveguide. As a result, very little reflection occurs from either amplifier-end cap interface 17 as light enters waveguide 12 from end cap 10 or amplifier-end cap interface 18 as light enters end cap 11 from waveguide 12. This is important at interface 17 because it prevents a significant amount of spontaneous emission which strikes interface 17 from being reflected back into waveguide 12, thus avoiding degradation of the amplifier. Furthermore, the tilted geometry causes light which emerges from waveguide 12 into end cap region 11 to strike interface 19 at such an angle that any reflected light propagating back into region 11 will strike interface 18 at a point which is sufficiently displaced from waveguide 12, thus allowing only minimal reflective coupling into the waveguide.

When the laser is operating, an optical input signal enters end cap region 10 and passes through amplifier-end cap interface 17 before being substantially coupled into waveguide 12. After propagating through the waveguide 12 and experiencing optical gain, the amplified signal encounters amplifier-end cap interface 18 and again experiences very little reflection due to the index-matching of end cap region 11 to waveguide 12. The unreflected light propagates through end cap region 11 and is strongly reflected at the end cap-air interface 19. However, because the light in the end cap region 11 is not guided and is displaced away from the waveguide by the angle between the waveguide and the outer facet, very little of the reflected light is coupled back into the amplifier, and thus the effective facet reflectivity is greatly reduced. The performance of the disclosed amplifier with respect to facet reflectivity requires an analysis of the behavior of light at the two surfaces mentioned above at which reflections can occur: the amplifier-end cap interface and the end cap-air interface. Accordingly, an analysis of both sources of reflection is discussed below for end cap region 11, and is also applicable to end cap region 10.

Figure 2A:
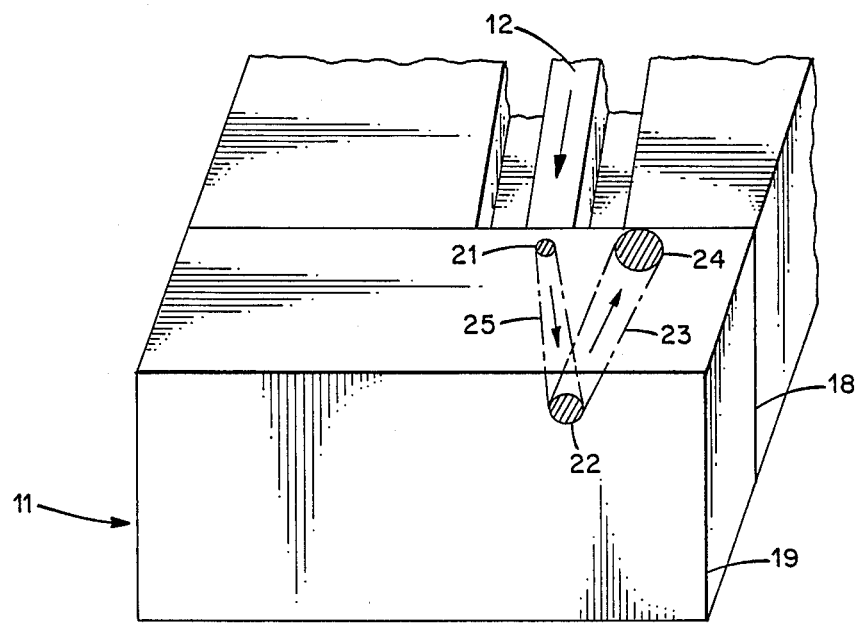
FIG. 2a is a frontal view of the laser amplifier of FIG. 1 showing the path of light which is reflected from one facet of the regrown end cap region.

FIG. 2a shows a perspective view of end cap region 11 to illustrate the path of an optical signal as it emerges from waveguide 12 at amplifier-end cap interface 18 and thereafter is strongly reflected from end cap-air interface 19. As indicated, a representative sample of the optical signal strikes amplifier-end cap interface 18 to form a beam spot 21 which is minimally reflected because of the index-matching of end cap 11 to waveguide 12. The non-waveguiding characteristic of end cap region 11 causes the optical wavefront 25 to diverge as it propagates through end cap 11 before becoming beam spot 22 at end cap-air interface 19. The reflected wavefront 23 diverges as it propagates back toward the amplifier through end cap region 11 and forms beam spot 24 upon reaching interface 18. Since the waveguide is angled with respect to the outer facet surface 19, the reflected wavefront 23 strikes facet 18 at a point which is laterally displaced from the waveguide 12. This misalignment between waveguide 12 and beam spot 24 is significant because it prevents the reflected wavefront from being coupled back into the waveguide. The following discussion regarding FIG. 2b provides an even more detailed analysis of the reflections at both interface 18 and 19 along with supporting graphs showing calculated reflectivity measurements.

Figure 2B:
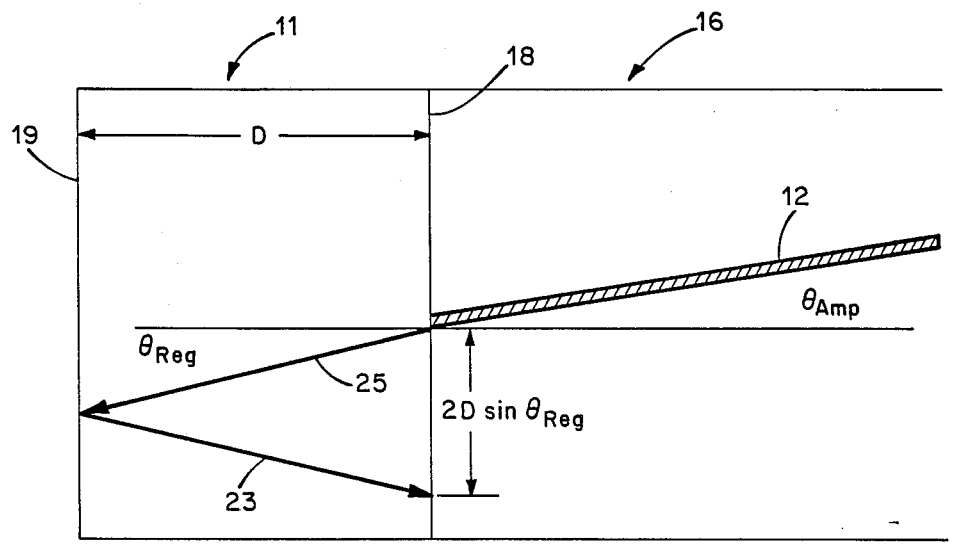

The coupling of reflected wavefront 23 back into the amplifier 16 from the end cap-air interface 19, as shown in FIG. 2b, is equivalent to the coupling of two waveguides separated by a distance 2D, where D is the thickness of end cap region 11, which have an angular misalignment of $2\theta_{Reg}$ and a lateral misalignment of 2D sin $\theta_{Reg}$. As described above and illustrated in FIG. 2b, the displacement of reflected wavefront 23 by 2D sin $\theta_{Reg}$ from waveguide 12 along the interface 18 is sufficient to allow only a minimal amount of reflected light to be coupled back into the waveguide. The analysis of the reflection includes an additional loss term due to the Fresnel reflection from the end cap-air interface. The analysis is supplemented by FIG. 3, which shows reflectivity versus D for wavelength tilt angles of 10° (curve 31) and 15° (curve 32) using Gaussian beam theory with a typical amplifier waveguide effective index of refraction of 3.35 and a mode radius of 0.5 microns.

Figure 3:
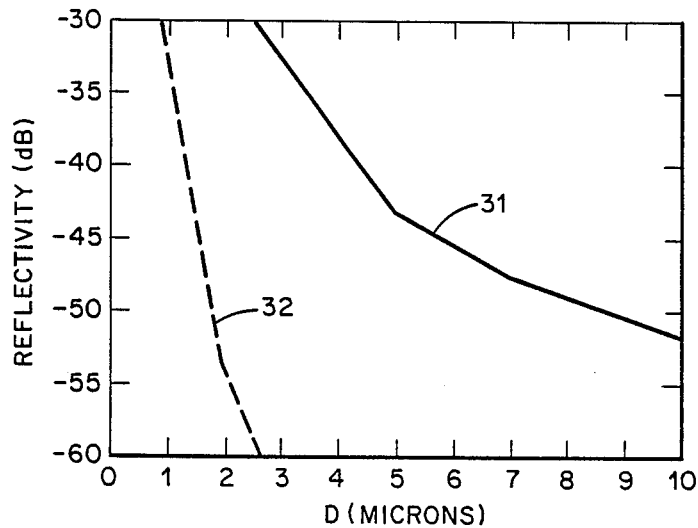
FIG. 3 is a graphical comparison of the reflectivity of the end cap-air interface versus the thickness of the regrown region at different waveguide tilt angles for the laser amplifier of FIG. 1.

Clearly, FIG. 3 shows that the reflectivity caused by the end cap-air interface falls off very rapidly with increasing thickness (D) of the regrown region. For a 10° tilted facet, 9 microns of regrown material is required to reduce the reflection to below $1 \times 10^{-5}$, while for a 15° tilted facet only 3 microns of regrown material is required. The thickness of the end cap region has an upper limit to prevent the optical beam propagating through end cap 11 from diverging to the extent that it would reach the surface of the regrown region and thereby cause scattering losses and make coupling to an output fiber very difficult. Alternatively, the end cap region must be thick enough to appropriately displace light which is reflected at the end cap-air interface so that only a minimal amount of light is coupled back into the waveguide.

The above analysis has shown that, in effect, the reflectivity of the end cap-air interface can be made arbitrarily small by controlling the thickness of the regrown region. Consequently, the reflectivity of a laser amplifier with regrown end caps will depend primarily on the reflectivity of the amplifier-end cap interface, as described below.

Referring again to FIG. 2b, the reflectivity of a facet at angle $\theta_{Amp}$ is calculated by modelling it as two slab waveguides at an angle $2\theta_{Amp}$, again including an extra loss term of the Fresnel reflection from the facet interface. This model is described by D. Marcuse in "Reflection Loss of Laser Mode From Tilted End Mirror," Journal of Lightwave Technology, Vol. 7, No. 2, February 1989. For a typical uncoated facet this additional Fresnel loss is only 0.3, but for the amplifier-end cap interface in the present invention this loss increases almost four orders of magnitude to approximately $5 \times 10^{-5}$. This is the key element in the ultra-low and reproducible reflectivity of a laser amplifier having regrown end cap regions.

Figure 4:
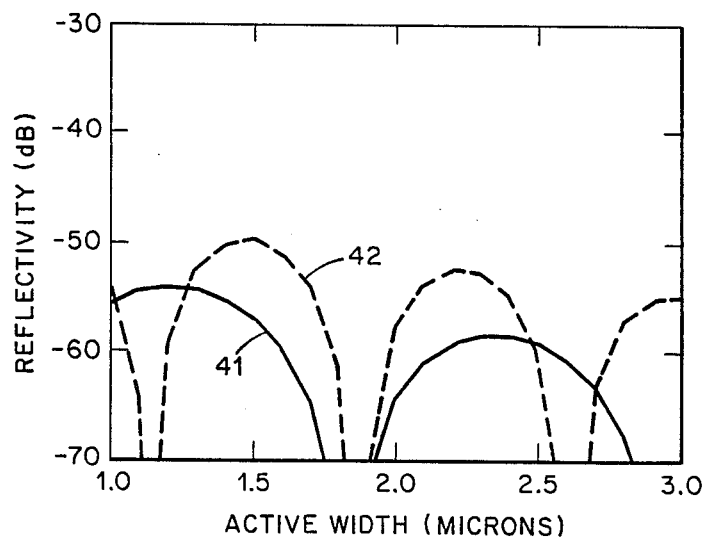
FIG. 4 is a graphical comparison of the reflectivity of the amplifier-end cap interface versus the thickness of the regrown region at different waveguide tilt angles for the laser amplifier of FIG. 1.

With regard to the amplifier of FIG. 1, the reflectivity of the amplifier-end cap interface as a function of amplifier active width for tilt angles of 10° (curve 41) and 15° (curve 42) is shown in FIG. 4, where a typical waveguide effective index of refraction of 3.35 and a regrown region of index 3.31 are assumed. As indicated, the reflectivity of a facet having a 10° tilt angle will always be less than $1 \times 10^{-5}$ with a reasonably wide active region.

A very desirable feature of the disclosed method for reducing reflectivity and the accompanying embodiment of FIG. 1 is that coupling a single mode fiber to a laser amplifier with regrown end caps would be exactly the same as with a conventional laser amplifier. Once the beam emerges from the regrown region 11, it is refracted out to the same angle as a normal laser far field, and therefore the same tapered and lensed fiber could be used for coupling to a laser amplifier with regrown end caps as is used for a conventional laser amplifier.

What has been shown and described herein is a novel method for reducing the facet reflectivity of an optical amplifier by fabricating the amplifier to have the following features: (1) a bulk regrown end cap region formed at both of the major facet surfaces of the amplifier, (2) an angled waveguide geometry, and (3) index-matching the end cap regions to the waveguide. Amplifiers fabricated with this novel method are capable of achieving extremely low facet reflectivities ($<10^{-5}$) while avoiding the use of problematic thin film anti-reflection coating techniques present in conventional devices. While the present invention is primarily concerned with the fabrication of semiconductor laser amplifiers, the use of bulk regrown end cap regions applies equally well to other semiconductor devices that require low reflectivity facets.

In summary, this method for reducing facet reflectivity has the following significant advantages over all other methods:

(1) ultra-low reflectivities ($<1 \times 10^{-5}$) are reproducibly obtained, (2) the devices embodying the disclosed method are amenable to mass production, (3) no facet coating step is required, (4) the facet reflectivity is insensitive to both wavelength and polarization, which is not the case with amplifiers using anti-reflection coatings, (5) very stable reflectivity has been demonstrated, and (6) no additional coupling losses are incurred in comparison to conventional laser amplifiers.

The last point enumerated above is significant with regard to the coupling ability of the conventional amplifier disclosed by Cha et al., discussed earlier in the present application. Cha et al. formed a 50 micron long window region of InP adjacent to a conventionally fabricated semiconductor optical amplifier having an active region of GaInAsP, thereby causing the propagating light beam to scatter off the surface of the device, and contributing to the unacceptable coupling loss of 8 dB demonstrated by the amplifier. In contradistinction, the amplifier of the present invention provides better coupling performance by fabricating an angled waveguide, allowing the end cap to be shorter.

What is claimed is:

1. An optoelectronic device, comprising:
a body of semiconductor material having a first and second opposed major facet surfaces, said body including a waveguiding structure through which an input optical signal propagates wherein said waveguiding structure is angled with respect to a longitudinal axis of said body oriented perpendicular to said first and second major facet surfaces;
a first regrown end cap region adjacent to said first major facet surface wherein the boundary between said first end cap region and said first major facet surface is an inner end cap facet interface, and wherein said first end cap region has an outer end cap facet opposed to said associated inner end cap facet interface;
a second regrown end cap region adjacent to said second major facet surface wherein the boundary between said second end cap region and said second major facet surface is an inner end cap facet interface, and wherein said second end cap region has an outer end cap facet opposed to said associated inner end cap facet interface;

wherein said first and second regrown end cap regions have an index of refraction which is approximately equal to an effective refractive index of said waveguiding structure, thereby providing a reduced facet reflectivity at both the inner end cap facet interface of said first regrown end cap region and the inner end cap facet interface of said second regrown end cap region;

wherein said first and second regrown end cap regions are fabricated from a non-waveguiding material having a sufficiently higher bandgap energy than that of the waveguide to prevent significant absorption of the optical signal in the end cap regions; and wherein said angled waveguide causes that portion of said optical signal which may be reflected from one of said outer end cap facets back into said respective end cap region to be sufficiently misaligned with said waveguide once it strikes the one of said outer end cap facets such that a minimum amount of said reflected signal is coupled back into said waveguiding structure, thereby further reducing the effective facet reflectivity of said optoelectronic device.

2. The optoelectronic device as recited in claim 1 wherein:
said body of semiconductor material forms a semiconductor laser amplifier.

3. The optoelectronic device as recited in claim 1 wherein:
said body of semiconductor material forms a superluminescent light emitting diode.

4. The optoelectronic device as recited in claim 1 further includes
a single mode fiber coupled to the outer end cap facet of one of said regrown end cap regions for receiving an output optical signal which has propagated through said waveguiding structure.

5. The optoelectronic device as recited in claim 1 wherein:
each of said inner end cap facet interfaces has an anti-reflection coating.

6. A method for reducing the facet reflectivity of an optoelectronic device, comprising the steps of
providing a body of semiconductor material having a first and second opposed major facet surfaces wherein said body includes a waveguiding structure through which an input optical signal propagates, and wherein said waveguiding structure is angled with respect to a longitudinal axis of said body oriented perpendicular to said first and second major facet surfaces;

forming a first regrown end cap region adjacent to said first major facet surface wherein the boundary between said first end cap region and said first major facet surface is an inner end cap facet interface, and wherein said first end cap region has an outer end cap facet opposed to said associated inner end cap facet interface;

forming a second regrown end cap region adjacent to said second major facet surface wherein the boundary between said second end cap region and said second major facet surface is an inner end cap facet interface, and wherein said second end cap region has an outer end cap facet opposed to said associated inner end cap facet interface;

wherein said first and second regrown end cap regions have an index of refraction which is approximately equal to an effective refractive index of said waveguiding structure, thereby providing a reduced facet reflectivity at both the inner end cap facet interface of said first regrown end cap region and the inner end cap facet interface of said second regrown end cap region;

wherein said first and second regrown end cap regions are fabricated from a non-waveguiding material having a sufficiently higher bandgap energy than that of the optical signal in the end cap regions; and wherein said which may be reflected from one of said optical signal which may be reflected from one of said outer end cap facets back into said respective end cap region to be sufficiently displaced from said waveguide once it strikes the one of said outer end cap facets such that a minimum amount of said reflected signal is coupled back into said waveguiding structure, thereby further reducing the effective facet reflectivity of said optoelectronic device.

7. The method for reducing facet reflectivity as recited in claim 6 further includes the step of:
applying a film of anti-reflection material to each of said major facet surfaces.

* * * * *